United States Patent
Guo et al.

(10) Patent No.: US 10,999,049 B1
(45) Date of Patent: May 4, 2021

(54) PHASE AND FREQUENCY CONTROL FOR CLOCK-DATA RECOVERY

(71) Applicant: Marvell International Ltd., Hamilton (BM)

(72) Inventors: Jianmin Guo, Sunnyvale, CA (US); Wenjie Li, Shanghai (CN); Jingjing Deng, Shanghai (CN); Changguo Shen, Nanjing (CN); Hui Wang, Pleasanton, CA (US); Xin Ma, San Jose, CA (US)

(73) Assignee: Marvell Asia Pte, Ltd., Singapore (SG)

( * ) Notice: Subject to any disclaimer, the term of this patent is extended or adjusted under 35 U.S.C. 154(b) by 96 days.

(21) Appl. No.: 16/376,282

(22) Filed: Apr. 5, 2019

Related U.S. Application Data

(60) Provisional application No. 62/653,388, filed on Apr. 5, 2018.

(51) Int. Cl.
  *H04L 7/00* (2006.01)
(52) U.S. Cl.
  CPC .................. *H04L 7/0041* (2013.01)
(58) Field of Classification Search
  CPC ................................................... H04L 7/0041
  USPC ........................................................ 375/371
  See application file for complete search history.

(56) References Cited

U.S. PATENT DOCUMENTS

| | | | | |
|---|---|---|---|---|
| 2010/0327924 | A1* | 12/2010 | Hasegawa | H04L 25/03885 327/155 |
| 2012/0128097 | A1* | 5/2012 | Hughes | H04L 25/03343 375/296 |

OTHER PUBLICATIONS

Chien, J., et al., "A Pulse-Position-Modulation Phase-Noise-Reduction Technique for a 2-to-16GHz Injection-Locked Ring Oscillator in 20nm CMOS", *2014 IEEE International Solid-State Circuits Conference*, Feb. 10, 2014, pp. 52-54.

(Continued)

*Primary Examiner* — Kevin M Burd

(57) ABSTRACT

A clock-data recovery circuit includes a variable data path delay, an injection-locked oscillator having a free-running frequency, and circuitry for adjusting at least one of the variable data path delay and the free-running frequency, including a counter configured to count repetitions of a bit value in an input data signal, and further being configured to, on occurrence of a first data pattern in the input data signal, indicative of saturation of inter-symbol interference, measure the input data signal at a first clock edge to determine a first data phase measurement value, measure the input data signal at clock centers immediately preceding and immediately following the first clock edge to determine second and third data phase measurement values, and based on first predetermined relationships among the first, second and third data phase measurement values, adjust the variable data path.

19 Claims, 5 Drawing Sheets

(56) References Cited

OTHER PUBLICATIONS

Lee, J., et al., "A 20Gb/s Burst-Mode CDR Circuit Using Injection-Locking Technique", *2007 IEEE International Solid-State Circuits Conference*, Feb. 12, 2007, pp. 46-48.

Maruko, K., et al., "A 1.296-to-5.184Gb/s Transceiver with 2.4mW/(Gb/s) Burst-mode CDR using Dual Edge Injection-Locked Oscillator", *2010 IEEE International Solid-State Circuits Conference*, Feb. 10, 2010, pp. 364-366.

Masuda, T., et al., "A 12Gb/s 0.9mW/Gb/s Wide-Bandwidth Injection-Type CDR in 28nm CMOS with Reference-Free Frequency Capture", *2016 IEEE International Solid-State Circuits Conference*, Feb. 2, 2016, pp. 188-190.

Sutardja, S., "The Future of IC Design Innovation" *2015 IEEE International Solid-State Circuits Conference*, Feb. 23, 2015, pp. 16-21.

\* cited by examiner

PHASE AND FREQUENCY CONTROL FOR CLOCK-DATA RECOVERY

CROSS REFERENCE TO RELATED APPLICATION

This disclosure claims the benefit of commonly-assigned U.S. Provisional Patent Application No. 62/653,388, filed Apr. 5, 2018, which is hereby incorporated by reference herein in its entirety.

FIELD OF USE

This disclosure relates to the phase and frequency control of an oscillator in a clock-data recovery circuit. More particularly, this disclosure relates to a structure and method for phase and frequency control of an injection-locked oscillator in a clock-data recovery circuit, which may be used in a receiver of a short-reach data link.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the present disclosure.

Short-reach data links are sometimes used for chip-to-chip communication when a reliable serial interface using low power at high speed is required. For example, as smaller semiconductor process nodes are developed, the cost of semiconductor devices increases. Therefore, there is an increasing prevalence of electronic devices that include multiple interconnected chips. In some cases, a more advanced process node is used only in an integrated circuit chip on which functions that require fast processing and high power consumption are implemented. Conversely, other less demanding features, such as legacy input/output features and other peripheral features, can be implemented on one or more integrated circuit chips at an older process node. The separate integrated circuit chips are then interconnected using one or more short-reach data links.

One advantage of a short-reach data link is low channel loss (~−12 dB). With such low channel loss, injection-locked oscillator-based (ILO-based) clock-data recovery (CDR) is practical. However, for ILO-based CDR to function correctly, the ratio of the oscillator free-running frequency (FRF) to the data rate must be kept constant.

SUMMARY

In accordance with implementations of the subject matter of this disclosure, a method of controlling at least one of phase and free-running frequency of an injection-locked oscillator in a clock-data recovery circuit includes, on occurrence of a first data pattern in an input data signal, measuring the input data signal at a first clock edge to determine a first data phase measurement value, measuring the input data signal at clock centers immediately preceding and immediately following the first clock edge to determine second and third data phase measurement values, and based on first predetermined relationships among the first, second and third data phase measurement values, adjusting a variable data path delay to correct phase.

In a first implementation of such a method, the first data pattern in the input data signal is indicative of saturation of inter-symbol interference in the input data signal.

A first variant of that first implementation may further include, on occurrence of a second data pattern in the input data signal, measuring the input data signal at a second clock edge to determine a first data frequency measurement value, measuring the input data signal at clock centers immediately preceding and immediately following the second clock edge to determine second and third data frequency measurement values, and based on second predetermined relationships among the first, second and third data frequency measurement values, adjusting the free-running frequency output of the injection-locked oscillator to correct frequency.

In that first variant, the second data pattern in the input data signal may be indicative of saturation of inter-symbol interference in the input data signal for a predetermined minimum duration. The first data pattern may include a first predetermined number of repetitions of data pulses all having a first bit value, followed by at least two data pulses both having a second bit value opposite the first bit value, and in the first predetermined relationships, a value of the input data signal, at the clock center immediately preceding the second clock edge, equal to the second bit value may indicate that adjusting the variable data path delay is unnecessary. In the first predetermined relationships, a value of the input data signal, at the clock center immediately preceding the second clock edge, equal to the first bit value may indicate that adjusting the variable data path delay is necessary according to the value of the input signal at the second clock edge and the value of the input signal at the clock center immediately following the second clock edge, and the variable data path delay is advanced when the input signal at the second clock edge and the input signal at the clock center immediately following the second clock edge have different bit values, and the variable data path delay is retarded when the value of the input signal at the second clock edge and the value of the input signal at the clock center immediately following the second clock edge both have the second bit value.

The second data pattern may include a second predetermined number of repetitions of data pulses all having a first bit value, followed by at least two data pulses both having a second bit value opposite the first bit value, and in the second predetermined relationships, a value of the input data signal, at the clock center immediately preceding the second clock edge, equal to the second bit value indicates that adjusting the free-running frequency output of the injection-locked oscillator is unnecessary. In the second predetermined relationships, a value of the input data signal, at the clock center immediately preceding the second clock edge, equal to the first bit value may indicate that adjusting the free-running frequency output of the injection-locked oscillator is necessary according to the value of the input signal at the second clock edge and the value of the input signal at the clock center immediately following the second clock edge, and the free-running frequency output of the injection-locked oscillator is advanced when the input signal at the second clock edge and the input signal at the clock center immediately following the second clock edge have different bit values, and the free-running frequency output of the injection-locked oscillator is retarded when the value of the input signal at the second clock edge and the value of the input signal at the clock center immediately following the second clock edge both have the second bit value. The second predetermined number of repetitions of data pulses all having the first bit value may be larger than the first predetermined number of repetitions of data pulses all having the first bit value.

In a second implementation of such a method, the first data pattern may include a first predetermined number of repetitions of data pulses all having a first bit value, followed by at least two data pulses both having a second bit value opposite the first bit value, and in the first predetermined relationships, a value of the input data signal, at the clock center immediately preceding the second clock edge, equal to the second bit value may indicate that adjusting the variable data path delay is unnecessary.

In a first variant of that second implementation, in the first predetermined relationships, a value of the input data signal, at the clock center immediately preceding the second clock edge, equal to the first bit value may indicate that adjusting the variable data path delay is necessary according to the value of the input signal at the second clock edge and the value of the input signal at the clock center immediately following the second clock edge, and the variable data path delay is advanced when the input signal at the second clock edge and the input signal at the clock center immediately following the second clock edge have different bit values, and the variable data path delay is retarded when the value of the input signal at the second clock edge and the value of the input signal at the clock center immediately following the second clock edge both have the second bit value.

A clock-data recovery circuit according to implementations of the subject matter of this disclosure includes a variable data path delay, an injection-locked oscillator having a free-running frequency, and circuitry for adjusting at least one of the variable data path delay and the free-running frequency, the circuitry for adjusting at least one of the variable data path delay and the free-running frequency including a counter configured to count repetitions of a bit value in an input data signal, the circuitry for adjusting the at least one of the variable data path delay and the free-running frequency further being configured to, on occurrence of a first data pattern in the input data signal, indicative of saturation of inter-symbol interference, measure the input data signal at a first clock edge to determine a first data phase measurement value, measure the input data signal at clock centers immediately preceding and immediately following the first clock edge to determine second and third data phase measurement values, and based on first predetermined relationships among the first, second and third data phase measurement values, adjust the variable data path delay to correct phase.

In a first implementation of such a clock-data recovery circuit, the circuitry for adjusting at least one of the variable data path delay and the free-running frequency may be further configured to, on occurrence of a second data pattern in the input data signal, the second data pattern being indicative of saturation of inter-symbol interference in the input data signal for a predetermined minimum duration, measure the input data signal at a second clock edge to determine a first data frequency measurement value, measure the input data signal at clock centers immediately preceding and immediately following the second clock edge to determine second and third data frequency measurement values, and based on second predetermined relationships among the first, second and third data frequency measurement values, adjust the free-running frequency output of the injection-locked oscillator to correct frequency.

In a first variant of the first implementation, the first data pattern may include a first predetermined number of repetitions of data pulses all having a first bit value, followed by at least two data pulses both having a second bit value opposite the first bit value, and the circuitry for adjusting at least one of the variable data path delay and the free-running frequency is further configured to not adjust the variable data path delay when in the first predetermined relationships, a value of the input data signal, at the clock center immediately preceding the second clock edge, is equal to the second bit value.

According to that first variant, in the first predetermined relationships, a value of the input data signal, at the clock center immediately preceding the second clock edge, equal to the first bit value may indicate that adjusting the variable data path delay is necessary according to the value of the input signal at the second clock edge and the value of the input signal at the clock center immediately following the second clock edge, and the circuitry for adjusting the at least one of the variable data path delay and the free-running frequency advances the variable data path delay when the input signal at the second clock edge and the input signal at the clock center immediately following the second clock edge have different bit values, and the circuitry for adjusting the at least one of the variable data path delay and the free-running frequency retards the variable data path delay when the value of the input signal at the second clock edge and the value of the input signal at the clock center immediately following the second clock edge both have the second bit value.

The second data pattern may include a second predetermined number of repetitions of data pulses all having a first bit value, followed by at least two data pulses both having a second bit value opposite the first bit value, and in the second predetermined relationships, a value of the input data signal, at the clock center immediately preceding the second clock edge, equal to the second bit value indicates that adjusting the free-running frequency output of the injection-locked oscillator is unnecessary. In the second predetermined relationships, a value of the input data signal, at the clock center immediately preceding the second clock edge, equal to the first bit value may indicate that adjusting the free-running frequency output of the injection-locked oscillator is necessary according to the value of the input signal at the second clock edge and the value of the input signal at the clock center immediately following the second clock edge, and the circuitry for adjusting the at least one of the variable data path delay and the free-running frequency advances the free-running frequency output of the injection-locked oscillator when the input signal at the second clock edge and the input signal at the clock center immediately following the second clock edge have different bit values, and the circuitry for adjusting the at least one of the variable data path delay and the free-running frequency retards the free-running frequency output of the injection-locked oscillator when the value of the input signal at the second clock edge and the value of the input signal at the clock center immediately following the second clock edge both have the second bit value. The second predetermined number of repetitions of data pulses all having the first bit value may be larger than the first predetermined number of repetitions of data pulses all having the first bit value.

In a second implementation of a clock-data recovery circuit, the first data pattern may include a first predetermined number of repetitions of data pulses all having a first bit value, followed by at least two data pulses both having a second bit value opposite the first bit value, and the circuitry for adjusting the at least one of the variable data path delay and the free-running frequency is further configured to not adjust the variable data path delay when in the first predetermined relationships, a value of the input data signal, at the clock center immediately preceding the second clock edge, is equal to the second bit value.

In that implementation, in the first predetermined relationships, a value of the input data signal, at the clock center immediately preceding the second clock edge, equal to the first bit value may indicate that adjusting the variable data path delay is necessary according to the value of the input signal at the second clock edge and the value of the input signal at the clock center immediately following the second clock edge, and the circuitry for adjusting the at least one of the variable data path delay and the free-running frequency advances the variable data path delay when the input signal at the second clock edge and the input signal at the clock center immediately following the second clock edge have different bit values, and the circuitry for adjusting the at least one of the variable data path delay and the free-running frequency retards the variable data path delay when the value of the input signal at the second clock edge and the value of the input signal at the clock center immediately following the second clock edge both have the second bit value.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
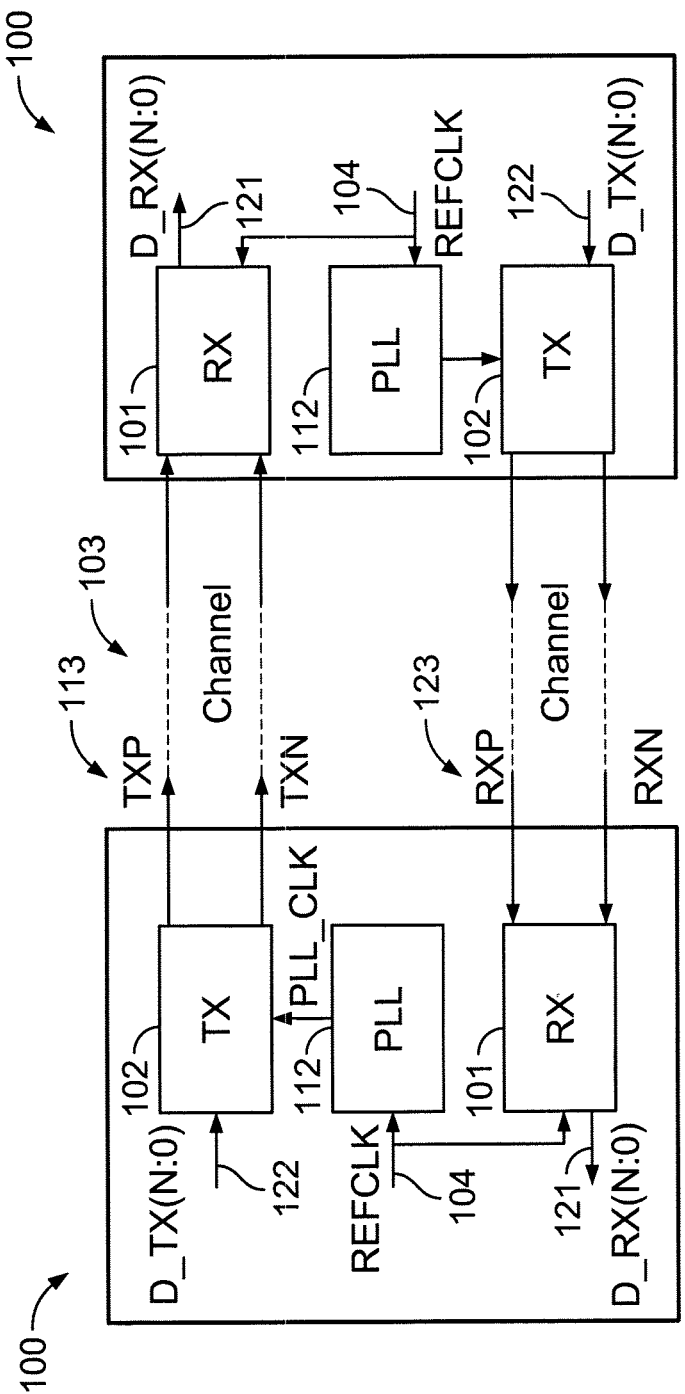
FIG. 1 is a block diagram of portions of respective integrated circuit devices incorporating respective transceivers used in a short-reach data link incorporating implementations of the subject matter of the present disclosure.

As noted above, short-reach data links are suitable for use between different integrated circuit chips under certain circumstances, such as when different parts of a system are implemented on different integrated circuit chips. As further noted above, low channel loss in a short-reach data link allows the use of ILO-based CDR. However, for ILO-based CDR to function correctly, the ratio of the free-running frequency (FRF) of the injection-locked oscillator to the data rate must be kept constant. Otherwise, large FRF error resulting from PVT drift (particularly temperature changes) will reduce tracking performance and make it difficult to support a data pattern with a long run of consecutive identical digits (CIDs).

Some known ILO-based CDR solutions use a phase-locked loop (PLL) along with the ILO for frequency tracking. However, such a solution requires substantial additional die area and increases power consumption.

Other known ILO-based CDR solutions use a phase detector (PD) to estimate the FRF error. The falling edge of the data is used for injection, and the rising edge of the data is used for FRF error sampling. However, the residual phase error sampled by the phase detector includes three components:

$$\Delta P_{tot} = \Delta P_{FRF\_ERR} + \Delta P_{DCD} + \Delta P_{ISI}$$

where $\Delta P_{tot}$ is the total phase difference, $\Delta P_{FRF\_ERR}$ is the integral of the FRF error, $\Delta P_{DCD}$ is the duty cycle distortion of the data, plus the sampling setup time difference between the rising edge and the falling edge, and $\Delta P_{ISI}$ is the inter-symbol interference (ISI) between the injection data edge and the FRF error sampling data edge. Because the phase difference includes components other than the FRF error, poor FRF tracking accuracy may result from using phase detection to measure the FRF error. Such an implementation may be able to support, for example, a PRBS9 8-bit/10-bit pattern, but cannot support, for example, a random data pattern with a long run of CIDs.

In accordance with implementations of the subject matter of this disclosure, FRF error is more accurately measured by measuring not only the phase error at a data edge, but also the data before and after the edge. This makes use of an injection-locked oscillator in applications such as, but not limited to, a short-reach data link, practical.

Measuring phase error at the same edge eliminates the duty-cycle distortion portion of the phase error. Variation based on the inter-symbol interference portion of the phase error is reduced or eliminated by measuring phase error only when inter-symbol interference is saturated.

Specifically, phase updates are performed by measuring phase error only after a number, M, of identical data pulses—followed by at least two opposite data pulses (i.e., M zeroes followed by 2 ones or M ones followed by two zeroes). The number, M, depends on the channel characteristics and is set to ensure that inter-symbol interference is saturated. Frequency updates are performed by measuring phase error only after a larger number M+N, of identical data pulses—followed by at least two opposite data pulses (i.e., M+N zeroes followed by 2 ones or M+N ones followed by two zeroes).

According to implementations of the subject matter of this disclosure, three measurements are taken at the nominal location of a data edge in the input data signal, as determined by the injection-locked oscillator. The three measurements are taken on the nominal data edge (i.e., on the clock edge), and at the nominal centers of the preceding and following unit intervals. Based on the states of those three signals, the oscillator frequency is advanced or retarded.

An implementation of the subject matter of this disclosure is described with reference to FIGS. 1-5.

Two integrated circuit devices, each incorporating a respective transceiver 100, and connected by a short-reach data link incorporating implementations of the subject matter of the present disclosure are shown in FIG. 1. Each integrated circuit device incorporates a respective transceiver 100 as well as other operational circuitry (not shown). each transceiver 100 includes a receiver 101 and a transmitter 102. A clock standard circuit 112 (as depicted, the clock standard is a PLL, but may be any other type of clock standard such as a digital PLL, or a frequency-locked loop (FLL)) is provided to control the transmit clock/frequency of transmitter 102. An (N+1)-bit data signal 122 originating on the integrated circuit chip on which transceiver 100 is present is input to transmitter 102 and transmitted at 113 onto channel 103 of the short-reach data link between the integrated circuit chips on which the respective transceivers 100 are located. As depicted in FIG. 1, channel 103 uses differential signaling, but a single-ended channel may be provided in some implementations.

Receiver 101 receives an (N+1)-bit signal 123 on channel 103, and recovers data 121. Receiver 101 does not need a clock/frequency signal from clock standard circuit 112 because receiver 101 recovers the clock from signal 123 as part of the ILO-based CDR process.

Figure 2:
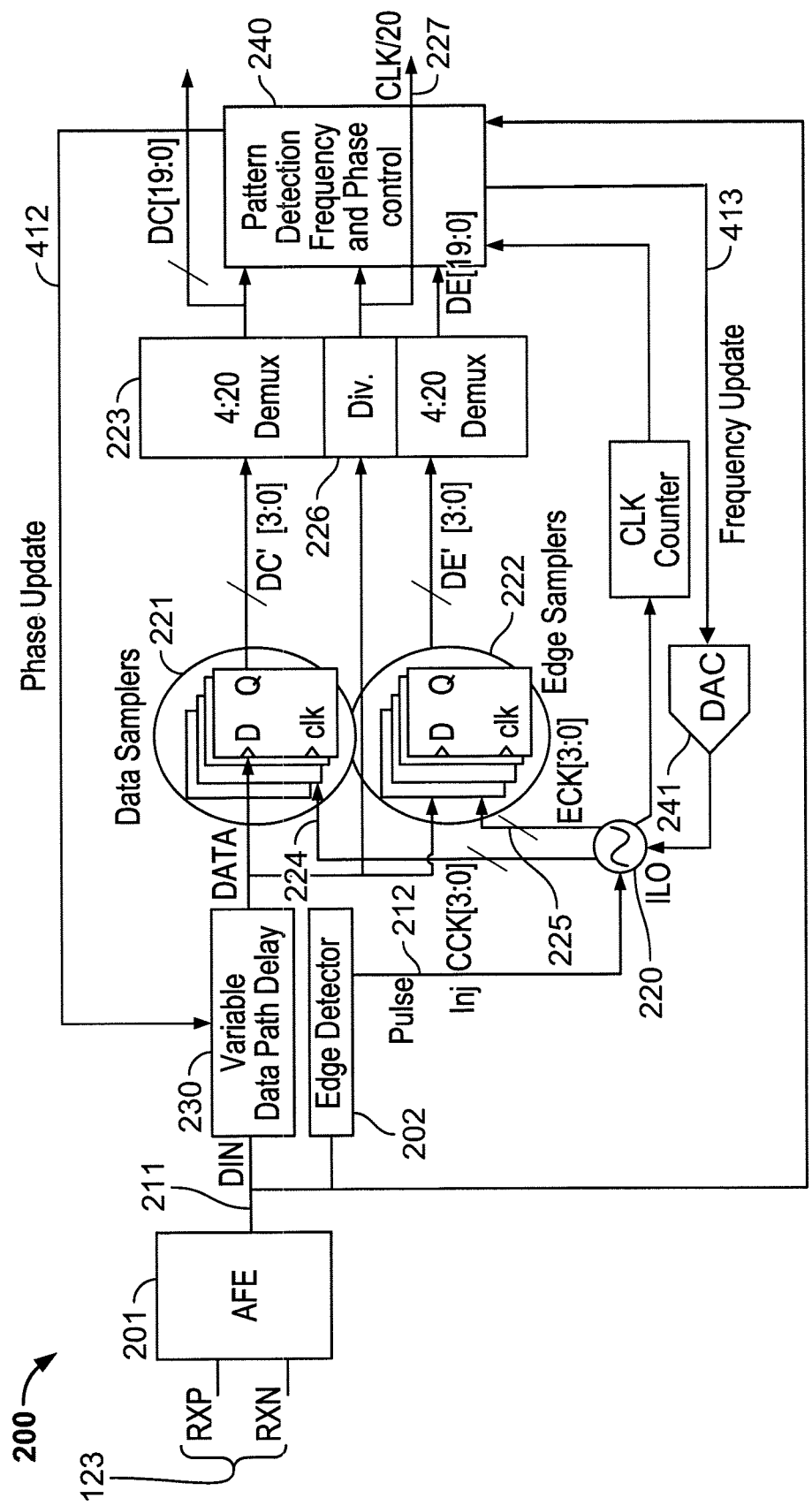
FIG. 2 is a schematic representation of an implementation of a receiver in the transceiver of FIG. 1.

An implementation 200, according to the subject matter of the present disclosure, of a receiver 101 is shown in FIG. 2. Receiver 200 includes an analog front-end (AFE) 201 that converts the analog differential signal 123 to a digital data in (DIN) signal 211. An edge detector 202 provides a pulse signal 212 in which there is a pulse for each rising or falling edge of DIN signal 211. Pulse signal 212 is injected to oscillator 220 and eventually aligns the edge clock (ECK) with the DIN edge, thus locking the oscillator 220 of receiver 101 with the incoming data.

Figure 3:
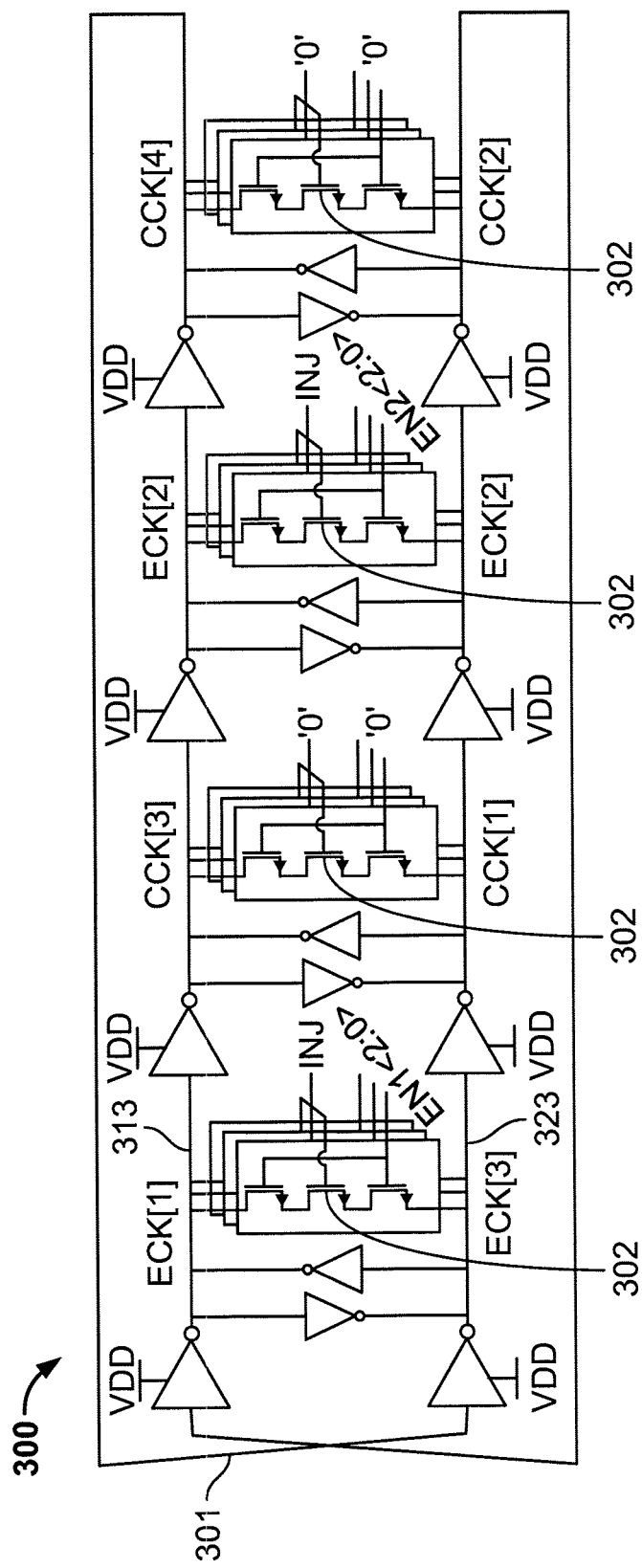
FIG. 3 is a schematic representation of an injection-locked oscillator used in implementations of the subject matter of the present disclosure.

ILO 220 may in some implementations have the structure 300 seen in FIG. 3, including four-stage ring oscillator 301 and transistor switches 302. Four-stage ring oscillator 301 operates as a voltage-controlled oscillator when the pulse signal 212 is equal to '0'. Increasing or decreasing the oscillator supply voltage VDD of the ring oscillator 301 will increase or decrease the FRF of ring oscillator 301. Injection of pulses of pulse signal 212 to one or more of switches 302 shorts together the two rails 313, 323 of ring oscillator 301 on occurrence of each pulse, eventually causing injection-locking of ILO 220 to the clock of DIN signal 211.

As noted above, to achieve a stable lock for ILO-based CDR requires that the free-running frequency of the ILO 220 be kept as close as possible to the clock of the incoming data. Data sampler 221 and edge sampler 222 together function as a bang-bang phase detector (BBPD) whose outputs are used both to advance or retard ILO 220 to control frequency, and to advance or retard a variable data path delay 230 to control phase, as described below. In the implementation shown, data sampler 221 is actually a plurality of data samplers because there may be a plurality of parallel data inputs. Similarly, edge sampler 222 is actually a plurality of edge samplers. The outputs of data sampler 221 and edge sampler 222 are demultiplexed by demultiplexer 223 and input into Pattern Detection Phase/Frequency Control module 240. Data sampler 221 and edge sampler 222 are clocked, respectively, by data clock output 224 of ILO 220 and edge clock output 225 of ILO 220. Data clock output 224 also is divided at 226 to provide a system clock 227.

Figure 4:
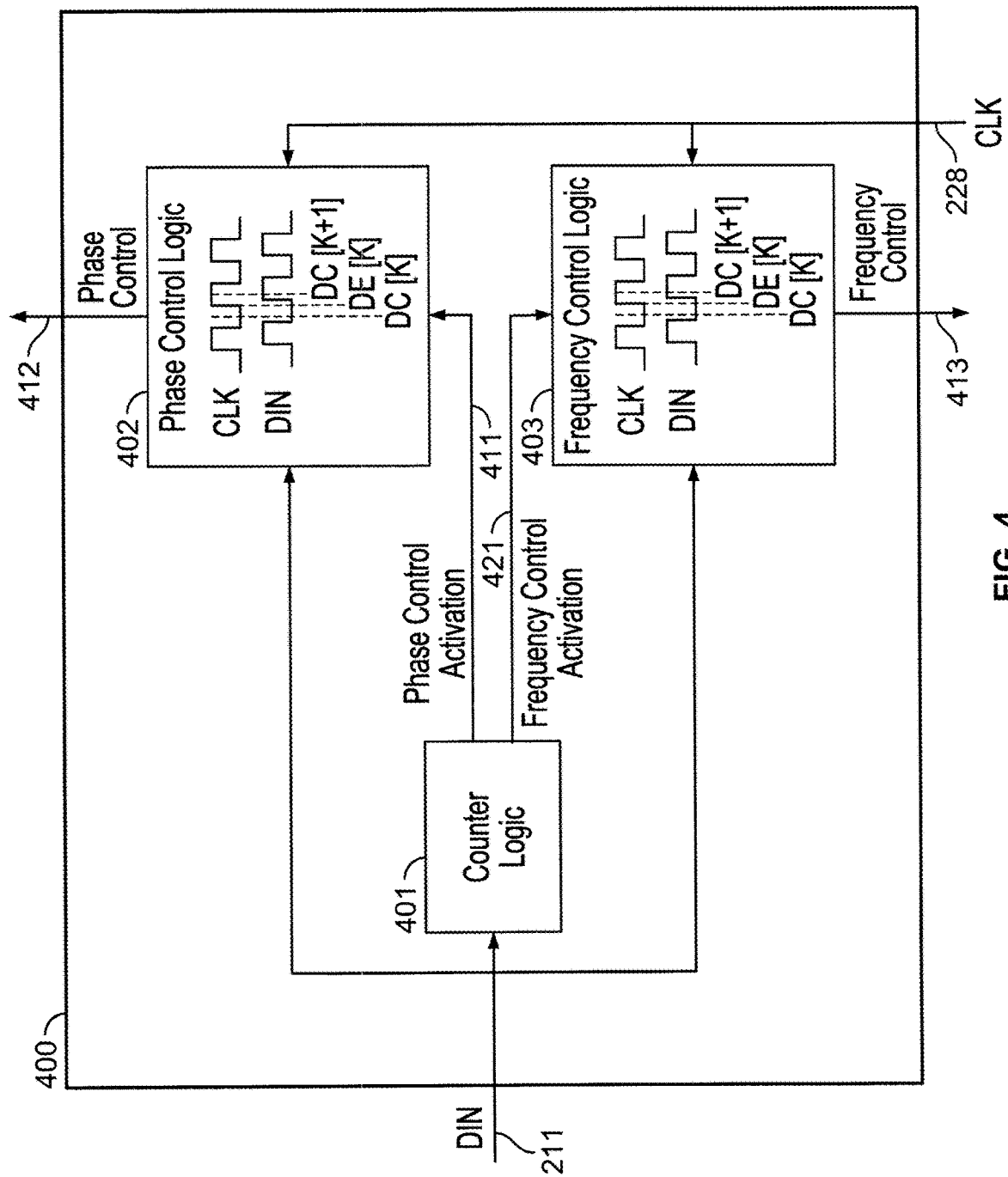
FIG. 4 is a schematic representation of a phase/frequency control module in accordance with implementations of the subject matter of the present disclosure.

One possible implementation 400 of Pattern Detection Phase/Frequency Control module 240 is shown in FIG. 4. Pattern Detection Phase/Frequency Control module 400 includes counter logic 401. If counter logic 401 detects, in DIN signal 211, more than M, but fewer than M+N, consecutive identical bits, followed by two opposite bits, counter logic 401 outputs a phase control activation signal 411. If counter logic 401 detects, in DIN signal 211, more than M+N consecutive identical bits, followed by two opposite bits, counter logic 401 outputs a frequency control activation signal 421.

Phase control activation signal 411 activates phase control logic 402, which sends a phase control or update signal 412 to advance or retard variable data path delay 230 depending on the comparison of the value of DIN signal 211 at a clock edge and at the clock centers preceding and following that clock edge. If the M consecutive identical bits, followed by two opposite bits, are M zeroes followed by two ones, then phase control or update signal 412 is determined in this implementation as follows:

TABLE 1

| DC [K] | DE [K] | DC [K + 1] | Phase control |
| --- | --- | --- | --- |
| 0 | 0 | 1 | UP |
| 0 | 1 | 1 | DN |
| 1 | x | x | y | where:
  DE[K] is the data sampled by the $K^{th}$ edge clock;
  DC[K] is the data sampled by the $K^{th}$ center clock (which precedes DE[K] by half of a unit interval);
  DC[K+1] is the data sampled by the $(K+1)^{th}$ center clock (which follows DE[K] by half of a unit interval);
  UP signifies advancing variable data path delay 230;
  DOWN signifies retarding variable data path delay 230;
  x signifies "don't care"; and
  y signifies "do nothing."

If the M consecutive identical bits, followed by two opposite bits, are M ones followed by two zeroes, then phase control or update signal 412 is determined as follows:

TABLE 2

| DC [K] | DE [K] | DC [K + 1] | Phase control |
| --- | --- | --- | --- |
| 1 | 1 | 0 | UP |
| 1 | 0 | 0 | DN |
| 0 | x | x | y |

Frequency control activation signal 421 activates frequency control logic 403, which sends a frequency control or update signal 413 via digital-to-analog converter 241 to advance or retard ILO 220 depending on the comparison of the value of DIN signal 211 at a clock edge and at the clock centers preceding and following that clock edge. If the M+N consecutive identical bits, followed by two opposite bits, are M+N zeroes followed by two ones, then frequency control or update signal 413 is determined as follows:

TABLE 3

| DC [K] | DE [K] | DC [K + 1] | Frequency control |
| --- | --- | --- | --- |
| 0 | 0 | 1 | UP |
| 0 | 1 | 1 | DN |
| 1 | x | x | y | where:
  DE[K] is the data sampled by the $K^{th}$ edge clock;
  DC[K] is the data sampled by the $K^{th}$ center clock (which precedes DE[K] by half of a unit interval);
  DC[K+1] is the data sampled by the $(K+1)^{th}$ center clock (which follows DE[K] by half of a unit interval);
  UP signifies advancing ILO 220;
  DOWN signifies retarding ILO 220;
  x signifies "don't care"; and
  y signifies "do nothing."

If the M+N consecutive identical bits, followed by two opposite bits, are M+N ones followed by two zeroes, then frequency control or update signal 413 is determined as follows:

TABLE 4

| DC [K] | DE [K] | DC [K + 1] | Frequency control |
|---|---|---|---|
| 1 | 1 | 0 | UP |
| 1 | 0 | 0 | DN |
| 0 | x | x | y |

Either or both of phase control logic 402 and frequency control logic 403 may be a programmable device such as a microprocessor or microcontroller programmed to implement the logic described above. Alternatively, either or both of phase control logic 402 and frequency control logic 403 may be a look-up table or set of look-up tables in which the values of three inputs representing DC[K], DE[K] and DC[K+1] select the appropriate phase control or update signal 412 or frequency control or update signal 413 in accordance with the tables presented above.

Figure 5:
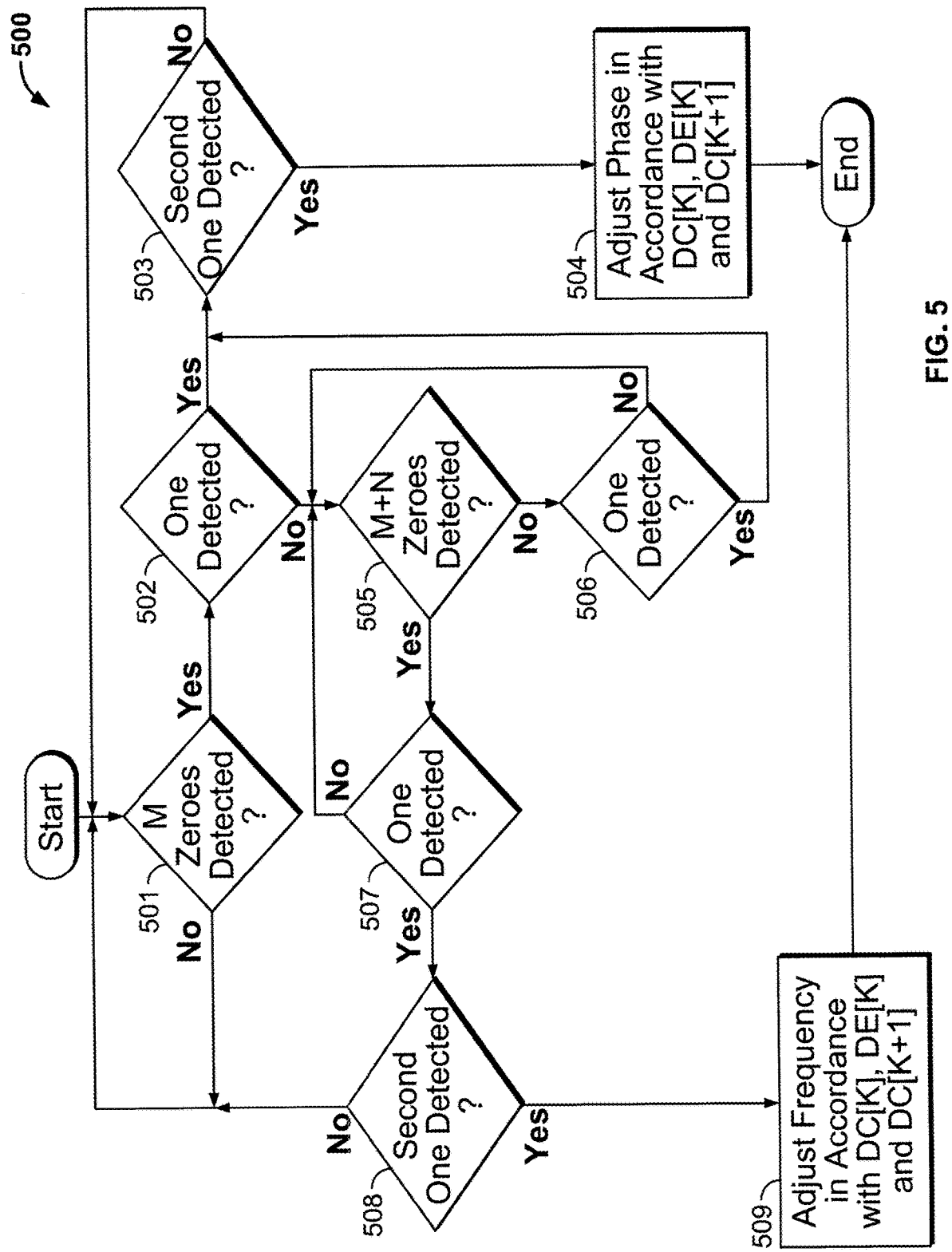
FIG. 5 is a flow diagram showing the operation of a method according to implementations of the subject matter of the present disclosure.

One implementation 500 of a method of operation of Pattern Detection Phase/Frequency Control module 240 is diagrammed in FIG. 5.

At 501, it is determined whether M zeroes have been detected. If not, flow returns to 501 until M zeroes have been detected. Once M zeroes have been detected at 501, then at 502, it is determined whether a one has been detected. If so, then at 503 it is determined whether a second one has been detected. If so, then at 504 phase is adjusted based on the values of DC[K], DE[K] and DC[K+1], according to Tables 1 and 2 above, and method 500 ends. If at 503 a second one is not detected, but rather a zero, then the required pattern for initiating phase adjustment has not been met and flow returns to 501 to again await detection of at least M zeroes.

If at 502 a one has not been detected after M zeroes, that means another zero has been detected. Flow continues to 505 where it is determined whether M+N zeroes have been detected. If not, then a string of more than M zeroes but fewer than M+N zeroes has been detected, which is a string of fewer than N zeroes followed by M zeroes, meaning that it is still the case the M zeroes have been detected.

At 506 it is determined whether a one has been detected. If not, then another zero has been detected and flow returns to 505 to determine whether M+N zeroes have been detected. If at 506 a one has been detected, meaning M zeroes (plus some number of zeroes fewer than N zeroes) have been followed by a one, then flow proceeds to 503 and continues as described above.

If at 505 it is determined that M+N zeroes have been detected, then flow proceeds to 507 to determine whether a one has been detected. If not, then a zero has been detected and flow returns to 505 to determine again that M+N zeroes have been detected (the answer will be "yes," even though there are additional zeroes beyond M+N zeroes), and then proceeds again to 507 to determine whether a one has been detected and flow proceeds as above.

If at 507 a one has been detected, then at 508 it is determined whether a second one has been detected. If so, then at 509 frequency is adjusted based on the values of DC[K], DE[K] and DC[K+1], according to Tables 3 and 4 above, and method 500 ends. If at 509 a second one is not detected, but rather a zero, then the required pattern for initiating frequency adjustment has not been met and flow returns to 501 to again await detection of at least M zeroes.

Thus it is seen that phase and frequency control for an injection-locked oscillator has been provided. This allows an injection-locked oscillator to be used for clock-data recovery in a short-reach data link having low channel loss, keeping the ratio of the oscillator free-running frequency (FRF) to the data rate constant.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A method of controlling at least one of phase and free-running frequency of an injection-locked oscillator in a clock-data recovery circuit, the method comprising:
   reducing contribution of inter-symbol interference to a measurement of phase error in an input data signal, by detecting occurrence of a first data pattern in the input data signal, the first data pattern being indicative of saturation of inter-symbol interference in the input data signal and, upon detecting occurrence of saturation of inter-symbol interference in the input data signal, as indicated by the first data pattern:
   measuring the input data signal at a first clock edge to determine a first data phase measurement value, and
   measuring the input data signal at clock centers immediately preceding and immediately following the first clock edge to determine second and third data phase measurement values; and
   based on first predetermined relationships among the first, second and third data phase measurement values, determining a phase error component other than phase error caused by inter-symbol interference and adjusting a variable data path delay to correct the phase error component other than phase error caused by inter-symbol interference.

2. The method of claim 1 further comprising:
   on occurrence of a second data pattern in the input data signal:
   measuring the input data signal at a second clock edge to determine a first data frequency measurement value,
   measuring the input data signal at clock centers immediately preceding and immediately following the second clock edge to determine second and third data frequency measurement values, and
   based on second predetermined relationships among the first, second and third data frequency measurement values, adjusting the free-running frequency output of the injection-locked oscillator to correct frequency.

3. The method of claim 2 wherein the second data pattern in the input data signal is indicative of saturation of inter-symbol interference in the input data signal for a predetermined minimum duration.

4. The method of claim 3 wherein:
   the first data pattern comprises a first predetermined number of repetitions of data pulses all having a first bit value, followed by at least two data pulses both having a second bit value opposite the first bit value; and
   in the first predetermined relationships, a value of the input data signal, at the clock center immediately preceding the second clock edge, equal to the second bit value indicates that adjusting the variable data path delay is unnecessary.

5. The method of claim 4 wherein:
   in the first predetermined relationships, a value of the input data signal, at the clock center immediately preceding the second clock edge, equal to the first bit value indicates that adjusting the variable data path delay is necessary according to the value of the input signal at the second clock edge and the value of the input signal at the clock center immediately following the second clock edge; and the variable data path delay is advanced when the input signal at the second clock edge and the input signal at the clock center immediately following the second clock edge have different bit values, and the variable data path delay is retarded when the value of the input signal at the second clock edge and the value of the input signal at the clock center immediately following the second clock edge both have the second bit value.

6. The method of claim 5 wherein:

the second data pattern comprises a second predetermined number of repetitions of data pulses all having a first bit value, followed by at least two data pulses both having a second bit value opposite the first bit value; and in the second predetermined relationships, a value of the input data signal, at the clock center immediately preceding the second clock edge, equal to the second bit value indicates that adjusting the free-running frequency output of the injection-locked oscillator is unnecessary.

7. The method of claim 6 wherein:

in the second predetermined relationships, a value of the input data signal, at the clock center immediately preceding the second clock edge, equal to the first bit value indicates that adjusting the free-running frequency output of the injection-locked oscillator is necessary according to the value of the input signal at the second clock edge and the value of the input signal at the clock center immediately following the second clock edge; and the free-running frequency output of the injection-locked oscillator is advanced when the input signal at the second clock edge and the input signal at the clock center immediately following the second clock edge have different bit values, and the free-running frequency output of the injection-locked oscillator is retarded when the value of the input signal at the second clock edge and the value of the input signal at the clock center immediately following the second clock edge both have the second bit value.

8. The method of claim 6 wherein the second predetermined number of repetitions of data pulses all having the first bit value is larger than the first predetermined number of repetitions of data pulses all having the first bit value.

9. The method of claim 1 wherein:

the first data pattern comprises a first predetermined number of repetitions of data pulses all having a first bit value, followed by at least two data pulses both having a second bit value opposite the first bit value; and in the first predetermined relationships, a value of the input data signal, at the clock center immediately preceding the first clock edge, equal to the second bit value indicates that adjusting the variable data path delay is unnecessary.

10. The method of claim 9 wherein:

in the first predetermined relationships, a value of the input data signal, at the clock center immediately preceding the first clock edge, equal to the first bit value indicates that adjusting the variable data path delay is necessary according to the value of the input signal at the first clock edge and the value of the input signal at the clock center immediately following the first clock edge; and the variable data path delay is advanced when the input signal at the first clock edge and the input signal at the clock center immediately following the first clock edge have different bit values, and the variable data path delay is retarded when the value of the input signal at the first clock edge and the value of the input signal at the clock center immediately following the first clock edge both have the second bit value.

11. A clock-data recovery circuit comprising:

a variable data path delay;

an injection-locked oscillator having a free-running frequency; and circuitry for adjusting at least one of the variable data path delay and the free-running frequency, the circuitry for adjusting at least one of the variable data path delay and the free-running frequency comprising:

a counter configured to count repetitions of a bit value in an input data signal, the circuitry for adjusting the at least one of the variable data path delay and the free-running frequency further being configured to:

on occurrence of a first data pattern in the input data signal, indicative of saturation of inter-symbol interference:

measure the input data signal at a first clock edge to determine a first data phase measurement value, measure the input data signal at clock centers immediately preceding and immediately following the first clock edge to determine second and third data phase measurement values, and based on first predetermined relationships among the first, second and third data phase measurement values, adjust the variable data path delay to correct phase.

12. The clock-data recovery circuit of claim 11 wherein the circuitry for adjusting at least one of the variable data path delay and the free-running frequency is further configured to:

on occurrence of a second data pattern in the input data signal, the second data pattern being indicative of saturation of inter-symbol interference in the input data signal for a predetermined minimum duration:

measure the input data signal at a second clock edge to determine a first data frequency measurement value, measure the input data signal at clock centers immediately preceding and immediately following the second clock edge to determine second and third data frequency measurement values, and based on second predetermined relationships among the first, second and third data frequency measurement values, adjust the free-running frequency output of the injection-locked oscillator to correct frequency.

13. The clock-data recovery circuit of claim 12 wherein:

the first data pattern comprises a first predetermined number of repetitions of data pulses all having a first bit value, followed by at least two data pulses both having a second bit value opposite the first bit value; and the circuitry for adjusting at least one of the variable data path delay and the free-running frequency is further configured to not adjust the variable data path delay when in the first predetermined relationships, a value of the input data signal, at the clock center immediately preceding the second clock edge, is equal to the second bit value.

14. The clock-data recovery circuit of claim 13 wherein:
in the first predetermined relationships, a value of the input data signal, at the clock center immediately preceding the second clock edge, equal to the first bit value indicates that adjusting the variable data path delay is necessary according to the value of the input signal at the second clock edge and the value of the input signal at the clock center immediately following the second clock edge; and the circuitry for adjusting the at least one of the variable data path delay and the free-running frequency advances the variable data path delay when the input signal at the second clock edge and the input signal at the clock center immediately following the second clock edge have different bit values, and the circuitry for adjusting the at least one of the variable data path delay and the free-running frequency retards the variable data path delay when the value of the input signal at the second clock edge and the value of the input signal at the clock center immediately following the second clock edge both have the second bit value.

15. The clock-data recovery circuit of claim 14 wherein:
the second data pattern comprises a second predetermined number of repetitions of data pulses all having a first bit value, followed by at least two data pulses both having a second bit value opposite the first bit value; and in the second predetermined relationships, a value of the input data signal, at the clock center immediately preceding the second clock edge, equal to the second bit value indicates that adjusting the free-running frequency output of the injection-locked oscillator is unnecessary.

16. The clock-data recovery circuit of claim 15 wherein:
in the second predetermined relationships, a value of the input data signal, at the clock center immediately preceding the second clock edge, equal to the first bit value indicates that adjusting the free-running frequency output of the injection-locked oscillator is necessary according to the value of the input signal at the second clock edge and the value of the input signal at the clock center immediately following the second clock edge; and the circuitry for adjusting the at least one of the variable data path delay and the free-running frequency advances the free-running frequency output of the injection-locked oscillator when the input signal at the second clock edge and the input signal at the clock center immediately following the second clock edge have different bit values, and the circuitry for adjusting the at least one of the variable data path delay and the free-running frequency retards the free-running frequency output of the injection-locked oscillator when the value of the input signal at the second clock edge and the value of the input signal at the clock center immediately following the second clock edge both have the second bit value.

17. The clock-data recovery circuit of claim 15 wherein the second predetermined number of repetitions of data pulses all having the first bit value is larger than the first predetermined number of repetitions of data pulses all having the first bit value.

18. The clock-data recovery circuit of claim 11 wherein:
the first data pattern comprises a first predetermined number of repetitions of data pulses all having a first bit value, followed by at least two data pulses both having a second bit value opposite the first bit value; and the circuitry for adjusting the at least one of the variable data path delay and the free-running frequency is further configured to not adjust the variable data path delay when in the first predetermined relationships, a value of the input data signal, at the clock center immediately preceding the first clock edge, is equal to the second bit value.

19. The clock-data recovery circuit of claim 18 wherein:
in the first predetermined relationships, a value of the input data signal, at the clock center immediately preceding the first clock edge, equal to the first bit value indicates that adjusting the variable data path delay is necessary according to the value of the input signal at the first clock edge and the value of the input signal at the clock center immediately following the first clock edge; and the circuitry for adjusting the at least one of the variable data path delay and the free-running frequency advances the variable data path delay when the input signal at the first clock edge and the input signal at the clock center immediately following the first clock edge have different bit values, and the circuitry for adjusting the at least one of the variable data path delay and the free-running frequency retards the variable data path delay when the value of the input signal at the first clock edge and the value of the input signal at the clock center immediately following the first clock edge both have the second bit value.

* * * * *